(12) United States Patent
Müller

(10) Patent No.: US 6,842,887 B2
(45) Date of Patent: Jan. 11, 2005

(54) DATA PROCESSING SYSTEM FOR DESIGNING A LAYOUT OF AN INTEGRATED ELECTRONIC CIRCUIT HAVING A MULTIPLICITY OF ELECTRONIC COMPONENTS AND METHOD OF DESIGNING A LAYOUT

(75) Inventor: Uwe Müller, München (DE)

(73) Assignee: Infineon Technologies AG, Munich (DE)

( * ) Notice: Subject to any disclaimer, the term of this patent is extended or adjusted under 35 U.S.C. 154(b) by 54 days.

(21) Appl. No.: 10/261,194

(22) Filed: Sep. 30, 2002

(65) Prior Publication Data

US 2003/0070152 A1 Apr. 10, 2003

(30) Foreign Application Priority Data

Sep. 28, 2001 (DE) .......................................... 101 49 021

(51) Int. Cl.⁷ ............................................. G06F 17/50
(52) U.S. Cl. ................... 716/11; 716/10; 716/8
(58) Field of Search ............................... 716/11, 10, 8, 716/1

(56) References Cited

U.S. PATENT DOCUMENTS 4,829,446 A    5/1989   Draney ........................ 716/11
5,440,720 A    8/1995   Baisuck et al. ................. 703/2
5,621,653 A  * 4/1997   Yuzawa .......................... 716/3

OTHER PUBLICATIONS

Heineken, H. T. et al.: "CAD at the Design–Manufacturing Interface", ACM, 1997, pp. 321–326.

* cited by examiner

Primary Examiner—Vuthe Siek
Assistant Examiner—Sun James Lin
(74) Attorney, Agent, or Firm—Lawrence A. Greenberg; Werner H. Stemer; Ralph E. Locher

(57) ABSTRACT

A data processing system includes a data memory, in which data are stored, the data representing a set of predetermined geometrical basic forms and a set of geometrical operations that can be applied to the basic forms. The basic forms form place markers for electronic components in the layout. In other words, each component is represented by a geometrical basic form or a combination of a plurality of geometrical basic forms. The basic forms can be altered during the layout design by application of the geometrical operations. Such alteration creates a large margin of freedom in the design. On the other hand, the unaltered original basic forms are examined for verification of the layout design. As a result, the verification is simplified and "dummy" errors that are often a consequence of the complexity of a design are avoided. A method for designing the layout with the system is also provided.

27 Claims, 8 Drawing Sheets

| BASIC FORM | PARAMETERS | EXTENDED PARAMETERS | GEOMETRICAL OPERATIONS |
|---|---|---|---|
| Rectangle | Length Width | Orientation Parallel to the long side | Beveling of a corner Gradation of a corner Notch along an edge |
| N-track without branching (at least one angle) | Length₁,...,Lengthₙ Angle₁,...,Angle(N-1) Width | Orientation₁,...,Orientationₙ | Beveling of a corner Gradation of a corner Notch along an edge |
| Triangle | Length₁ Length₂ Length₃ | Orientation (mid point shortest side and opposite vertex) | Beveling of a corner Gradation of a corner Notch along an edge |
| Trapezoid | Basic line a Basic line b Length c Length d | Orientation (perpendicular to the parallel basic lines) | Gradation of a corner Notch along an edge |
| N-track with branching (at least two angles) | Lengthₓ₁,...,Lengthₓₙ per Branchₓ Angleₓ₁,...,Angleₓ(N-1) per Branch Width b x per Branch | Orientation x. Along the segments x. of a branch | Beveling of a corner Gradation of a corner Notch along an edge |

```
Determine the short and long edges

10 Edges_K˜       = geomGetEdges( K˜ );                                      #Op = 8

20 Long_edges_K˜= drc(Length edges_K˜ > w1 ) );                              #Cp = 8
30 Short_edges_K˜= geomAndNot(Edges_K˜ Long_edges_K˜);                       #Cp = 8 * 4 = 32

40 Edges_A˜˜     = geomGetEdges( A˜˜ ) );                                    #Op = 8
50 Long_edges_A˜˜= drc(Length edges_A˜˜ > w1 ) );                            #Op = 8
60 Short_edges_A˜˜= geomAndNot(Edges_A˜˜ Long_edges_A˜˜);                    #Op = 8 * 4 = 32

; Checking the length of the edges 80 drc( Short_edges_K˜ Short_edges_A˜˜ sep >= s1);                           #Op =15
90 drc( Long_edges_K˜ Long_edges_A˜˜ sep >= d1);                             #Op =16
```

Program 1

```
10 if ( Short_side( AA˜˜) = w1 ){                                      ;     #Cp = 4

20 Distance( Side ( AA˜˜ short) Side( K˜ short) >= s1 );                     #Op = 16
30 Distance( Side ( AA˜˜ long ) Side ( K˜ long ) >= d1 );                    #Op = 16
}           Long edges
40 if ( Short side( AA˜˜) = w2 ){
50 Distance( Short side( AA˜˜) Short side( K˜) >= s2 );                      #Op = 16
60 Distance( Long side( AA˜˜) Long side( K˜) >= d2 );                        #Op = 16
}
```

Program 2

FIG. 2

| BASIC FORM | PARAMETERS | EXTENDED PARAMETERS | GEOMETRICAL OPERATIONS |
|---|---|---|---|
| Rectangle | Length<br>Width | Orientation<br>Parallel to the long side | Beveling of a corner<br>Gradation of a corner<br>Notch along an edge |
| N-track without branching (at least one angle) | $Length_1,...,Length_N$<br>$Angle_1,...,Angle_{(N-1)}$<br>Width | $Orientation_1,...,Orientation_N$ | Beveling of a corner<br>Gradation of a corner<br>Notch along an edge |
| Triangle | $Length_1$<br>$Length_2$<br>$Length_3$ | Orientation (mid point shortest side and opposite vertex) | Beveling of a corner<br>Gradation of a corner<br>Notch along an edge |
| Trapezoid | Basic line a<br>Basic line b<br>Length c<br>Length d | Orientation (perpendicular to the parallel basic lines) | Gradation of a corner<br>Notch along an edge |
| N-track with branching (at least two angles) | $Length_{x1},...,Length_{xN}$ per $Branch_x$<br>$Angle_{x1},...,Angle_{x(N-1)}$ per Branch<br>Width b x per Branch | Orientation $x_i$<br>Along the segments $x_i$ of a branch | Beveling of a corner<br>Gradation of a corner<br>Notch along an edge |

FIG.6

DATA PROCESSING SYSTEM FOR DESIGNING A LAYOUT OF AN INTEGRATED ELECTRONIC CIRCUIT HAVING A MULTIPLICITY OF ELECTRONIC COMPONENTS AND METHOD OF DESIGNING A LAYOUT

BACKGROUND OF THE INVENTION

Field of the Invention

The fabrication process of large-scale integrated electronic circuits begins with the layout design, which is intended to determine the functionality of the circuit. The layout defines the physical implementation of the circuit on a silicon wafer. Prior art methods for fabricating the circuit on the wafer are based on lithography, i.e., that, inter alia, the circuit layout is imaged first onto a mask and, then, onto the wafer through exposure of the mask.

Overall, a chip is fabricated in many steps. Each of the fabrication steps has an intrinsic inaccuracy that should ideally be taken into account as early as in the layout design. To that end, rules are provided (so-called design or layout rules) that must be taken into consideration in the layout design to ensure that the layout can actually be fabricated later. By way of example, such layout rules may determine the minimum distance between two transistors or the width of metal tracks.

After completion of the layout design, the layout is tested according to these layout rules and corrected, if appropriate. This step is called verification and is carried out by a computer. Because the components of an integrated circuit are represented by polygons in the layout, the layout rules relate to the geometrical properties of the polygons and their geometrical relationships among one another. By way of example, a diode including a p-conducting and an n-conducting region is represented by adjoining rectangles in the layout.

In the simplest case, a layout rule can relate to a single dimension. By contrast, complex layout rules relate a large number of dimensions to one another. Whereas simple layout rules can still usually be implemented by a single instruction of the verification software, the implementation of complex layout rules requires numerous instructions, the number of instructions increasing with the complexity of the layout rules. Such a process is problematic because even the processing of an individual instruction requires a high computation time or computing power because, as a rule, each instruction has to process a subset of all the polygons of a layout (for such a purpose, the polygons are stored in a database).

Furthermore, the number of instructions required for implementing a layout rule greatly depends on the "powerfulness" of the respective instruction. The instruction set of existing programming languages used to create the verification software unnecessarily restricts the possibilities for the programmer in the implementation of layout rules. Generally, at the present time, it is only possible to determine the geometrical relationships and properties, that is to say, the distances between polygons or the dimensions thereof. Furthermore, it is possible to carry out set operations, such as, for example, the formation of intersection, union, and complement sets. As a rule, the same operations can also be applied to the edges of the polygons. Under these preconditions, complex layout rules can be formulated only using numerous instructions. As a result, the computation time increases to an undesirable extent. Many layout rules are even formulated such that the instruction set of the verification software is insufficient and so-called dummy errors (purported errors) have to be accepted.

SUMMARY OF THE INVENTION

It is accordingly an object of the invention to provide a data processing system for designing a layout of an integrated electronic circuit including a multiplicity of electronic components that overcomes the hereinaforementioned disadvantages of the heretofore-known devices and methods of this general type and that at least reduces the above-mentioned problems.

With the foregoing and other objects in view, there is provided, in accordance with the invention, a data processing system for designing a layout of an integrated electronic circuit having a multiplicity of electronic components, including a processor programmed to process data including first data defining a predetermined set of geometrical basic forms through a multiplicity of basic-form-specific and permanent geometrical parameters, and a predetermined assignment of each of the electronic components of a layout design to the respective one of the geometrical parameters defining at least one of the geometrical basic forms, and second data representing a multiplicity of geometrical operations, the geometrical operations to be applied to the geometrical basic forms to form geometrical figures differing from the geometrical basic forms, the geometrical parameters defining a geometrical basic form unalterable through application of one of the geometrical operations to the geometrical basic form, and a data memory connected to the processor and storing the data, the processor programmed to at least one of store the data in the data memory and read the data from the data memory;

The invention provides a data processing system for designing a layout of an integrated electronic circuit including a multiplicity of electronic components, having a data memory and a processor for storing data in the data memory and/or for reading data from the data memory, the data memory:

a) storing first data, which define a predetermined set of geometrical basic forms through a multiplicity of basic-form-specific and permanent geometrical parameters, and also a predetermined assignment of each of the electronic components of a layout design to the respective parameters defining one or more of the geometrical basic forms; and b) storing second data, which represent a multiplicity of geometrical operations—which can be applied to the geometrical basic forms—for forming geometrical figures that differ from the geometrical basic forms, the parameters defining a geometrical basic form being unalterable through application of a geometrical operation to this geometrical basic form.

Using predetermined geometrical basic forms significantly simplifies a check of the layout by verification software because the number of basic forms is limited, and each of the basic forms is defined by specific geometrical properties. On the other hand, the configurational freedom in the layout design is not restricted either because geometrical basic forms are available that can be used to form new geometrical figures by application to the predetermined basic forms, those parameters that define the basic forms, thereby, remaining unaltered, however.

In accordance with another feature of the invention, each electronic component can be represented by a combination of a plurality of geometrical basic forms. The data relating to the geometrical basic forms may be able to be retrieved from the data memory by the processor, for checking the layout design by application of a predetermined set of layout rules to the geometrical parameters represented by the retrieved data.

Because, during the verification of the layout design, parameters that describe the geometrical basic forms are always tested, and not the forms modified by application of the geometrical operations, the verification is not complicated by increasing complexity of the geometrical forms. Thus, "dummy" errors can be reduced or even precluded.

In accordance with a further feature of the invention, the parameters may represent edges of the geometrical figures, the number and length thereof, the angles thereof among one another, etc. The parameters may also represent the orientation of the respective basic form. The respective parameter describing the orientation is, preferably, formed by a unit vector. Such formation makes it possible to ascertain the orientation of one electronic component relative to another simply by forming the scalar product.

In accordance with an added feature of the invention, the geometrical parameters may, additionally, describe the position and/or the profile of the edges of each of the geometrical basic forms in a reference system defined with respect to the layout design. Such a process simplifies, in particular, distance determinations between electronic components.

In accordance with an additional feature of the invention, each of the geometrical parameters describes a form of a respectively assigned geometrical basic form.

In accordance with yet another feature of the invention, each of the geometrical parameters describes an absolute position of a respectively assigned geometrical basic form in a reference system defined with respect to the layout design.

In accordance with yet a further feature of the invention, each of the geometrical parameters describes a relative position of a respectively assigned geometrical basic form with respect to other geometrical basic forms in a reference system defined with respect to the layout design.

In accordance with yet an added feature of the invention, each of the geometrical parameters describes an orientation of a respectively assigned geometrical basic form in a reference system defined with respect to the layout design, from which an orientation of an assigned electronic component can be derived respectively.

In accordance with yet an additional feature of the invention, each of the geometrical parameters describes an orientation of a respectively assigned geometrical basic form relative to other geometrical basic forms in a reference system defined with respect to the layout design, from which an orientation of an assigned electronic component relative to an orientation of an electronic components assigned to other geometrical basic forms can be derived respectively.

In accordance with again another feature of the invention, the geometrical figures are formed by polygons, and the set of geometrical basic forms is formed by a predetermined set of polygons. In such a case, the predetermined set of polygons may contain rectangles, N-tracks without branching, triangles, trapezoids, N-tracks with branching, etc.

In accordance with again a further feature of the invention, the processor is programmed to form each geometrical figure produced by application of a geometrical operation to a geometrical basic form with a polygon.

In accordance with again an added feature of the invention, preferably, the processor is constructed for the generation of a first output signal, and for the display of information representing the geometrical basic forms and the geometrical operations, preferably, on a screen, and the data processing system is constructed for the selection of the displayed geometrical basic forms and operations by a user by input measures, for an application of a selected geometrical operation to a selected geometrical basic form, the processor additionally being constructed for the generation and storage of data in the data memory that represent an assignment of the selected geometrical basic form to the selected geometrical operation.

Thus, a flexible development tool is created, without making the verification of designed layouts more difficult.

In accordance with again an additional feature of the invention, the processor is preferably constructed for the calculation of a geometrical figure that is formed by application of the selected geometrical operation to the selected geometrical basic form, and for the generation of a second output signal, for the display of the geometrical figure, preferably, on a screen.

In accordance with still another feature of the invention, the selected geometrical basic form preferably differs only in its shape from the geometrical figure formed by application of the selected geometrical operation.

In accordance with still a further feature of the invention, the data processing system is constructed for the interactive geometrical modification of displayed geometrical basic forms to be selected, by a graphical user interface.

The invention furthermore provides a method for designing a layout of an integrated electronic circuit, including a multiplicity of electronic components, having the steps of (i) retrieval of data from a data memory that represent geometrical basic forms, each of the electronic components being assigned to one or more of the geometrical basic forms, (ii) selection and configuration of one of the selected geometrical basic forms within a reference system defined for the layout design, (iii) retrieval of data from a data memory that represent a multiplicity of geometrical operations that can be applied to the geometrical basic forms, (iv) selection and application of one of the geometrical operations to the geometrical basic form selected in step (ii), for the generation of a geometrical figure differing in shape from the geometrical basic form, and (vii) generation and storage of data that represent an assignment of the geometrical basic form selected in step (ii) to the selected geometrical operation applied thereto. Preferably, a computer program designs the layout of an integrated electronic circuit having electronic components on a computer.

With the objects of the invention in view, there is also provided a method for designing a layout of an integrated electronic circuit having electronic components, including the steps of providing data in a data memory, a first portion of the data representing geometrical basic forms and a second portion of the data representing a set of geometrical operations to be applied to a respective one of the geometrical basic forms, retrieving at least some of the first portion of the data from the data memory, assigning each of the electronic components of the electronic circuit to at least one of the geometrical basic forms, selecting and configuring one of the selected geometrical basic forms within a reference system defined for the layout design, retrieving at least some of the second portion of the data from the data memory, selecting and applying one of the geometrical operations to the geometrical basic form selected in the selecting and configuring step to generate a geometrical figure differing in shape from the geometrical basic form, and generating and storing data representing an assignment of the geometrical basic form selected in the selecting and configuring step to the selected geometrical operation applied thereto. Preferably, a computer program designs the layout of an integrated electronic circuit having electronic components on a computer.

The method according to the invention combines the advantages of a high freedom of configuration in the layout design with a simple testability of the layouts, thus, designed.

With the objects of the invention in view, there is also provided a data processing system for the layout design of an integrated electronic circuit, having a first data memory, which stores a number of data entries, each of which contains a set of parameters that represents a predetermined geometrical basic form, and a processor for reading first data from a second data memory, which represent a multiplicity of geometrical figures, and for processing the first data for ascertaining correspondence of each of the geometrical figures represented by the first data to one of the sets of parameters, and for generating second data, which represent an assignment of each of the geometrical figures to in each case that one of the geometrical basic forms to whose set of parameters correspondence was ascertained.

The invention is based on the insight that a layout verification can be significantly simplified by storing, with respect to each polygon, information about the shape and geometrical properties thereof in the database that is accessed during the layout verification. Furthermore, the verification can be simplified by assigning each polygon to a class defined by a geometrical basic form and an associated set of geometrical operations. Thus, for example, rectangles can be derived from the basic form of a square of side length one.

Rectangles, in particular, can be geometrically modified, however, for example, by beveling corners; nevertheless, in his/her intelligence the human would indeed still perceive the polygon resulting from the geometrical variation as a rectangle. This "fuzziness" of human perception is exploited and each class of polygons is assigned geometrical operations by which, although the assigned polygons are geometrically modified, the class association thereof, nonetheless, remains unaltered.

Furthermore, each polygon of a class is assigned the characteristic properties or parameters of its geometrical basic form. Thus, by way of example, all polygons from the class "rectangles" have a length and a width, or all L forms have a limb length and an angle between the limbs. Such class-specific parameters of a polygon are stored in the database that is accessed by the verification software.

Such classification of the polygons into classes and the introduction of class-specific parameters and of geometrical operations significantly facilitate the verification. Such a data structure corresponds to human associative thinking and figurative imagination. Even complicated layout rules can, thus, be implemented with a few instructions. As a consequence, although the memory requirement increases for each polygon, in return, the computation time during verification is reduced.

Other features that are considered as characteristic for the invention are set forth in the appended claims.

Although the invention is illustrated and described herein as embodied in a data processing system for designing a layout of an integrated electronic circuit including a multiplicity of electronic components, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a listing of two programs for verification of a layout;

FIG. 6 is a table describing geometrical basic forms and geometrical operations for creating a layout;

DESCRIPTION OF THE PREFERRED EMBODIMENTS

The text below presents problems arising during the verification by layout rules when using prior art verification software. The problems are contrasted with solutions based on a verification oriented to geometrical basic forms. A selection of such geometrical basic forms that can be used to create a layout is subsequently presented. Afterward, the text sets forth how a verification oriented to basic forms can be implemented to corresponding software.

By virtue of the fact that integrated circuits become more and more complex, the layout rules used also become more complicated because, as a rule, geometrical properties of the polygons representing the individual components and relationships between the polygons must be taken into account. The problems that result therefrom for the verification are explained using the three examples below.

EXAMPLE I

Contact on an "Active Area"

Figure 1:
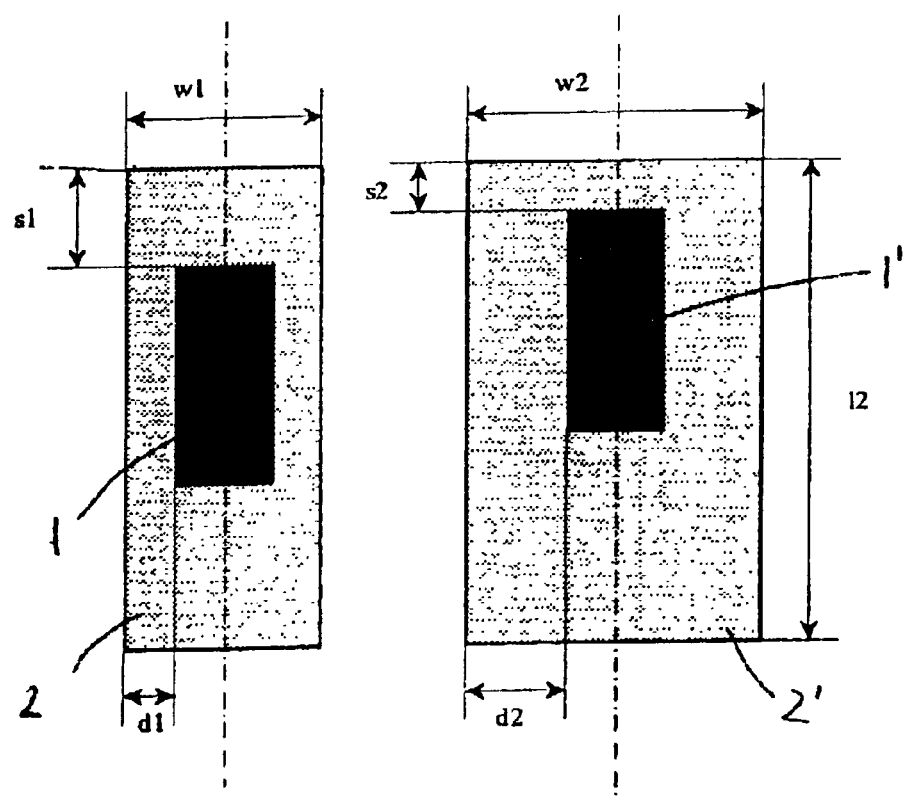
FIG. 1 is a diagrammatic illustration of a contact of constant size on the "active area" of two substrates.

In FIG. 1, the dark rectangles correspond to two identical contacts 1 and 1', which are symmetrically embedded in active areas 2 and 2', respectively, of a wafer, the active areas 2, 2' being shown with shading. The active areas 2, 2' have an arbitrary length. The dimensions w1 and w2 describe the width of the active areas 2, 2', respectively, while the dimensions s1 and s2 designate predetermined minimum distances between the top end of the contact 1 and 1', respectively, in FIG. 1 and the upper edge of the active areas 2 and 2', respectively. The dimensions d1 and d2 designate predetermined minimum distances between the left-hand end of the contacts 1 and 1', respectively, in FIG. 1 and the left-hand edge of the active areas 2 and 2', respectively.

These minimum distances and also the symmetrical configuration of the contacts 1 and 1' within the active areas 2 and 2', respectively, form layout rules that are checked during the verification.

During the fabrication process, the longitudinal extent (i.e., the vertical extent in the orientation of FIG. 1) of the active areas 2 and 2' is shortened, the shortening depending on the width w1 and w2 of the active areas 2 and 2', respectively. However, so that the contacts 1 and 1' are not damaged or destroyed by the shortening of the active areas 2 and 2', respectively, it is necessary, in accordance with a further layout rule, given a smaller width w1 of the edge of the active area 2, for the contact 1 to have a larger distance s1 than the contact 1' on the active area 2' with the larger width w2.

A conventional verification is now effected by determining, from the contact layer, all the polygons that lie completely within an active area polygon. The sets of contacts K' and of active area polygons A' are, thereby, defined. A set A" of polygons having the width w1 and a set A'" of polygons having the width w2 are subsequently determined from the set A'.

The test is easy to formulate in the case of identical dimensions s1 and d1. The test requires that the distance between an arbitrary edge of the contacts 1 and 1' and the nearest edge of the active areas 2 and 2', respectively, be not less than s1=d1 and s2=d2, respectively. The geometrical form of the contacts need not be taken into account.

However, the test becomes significantly more difficult if the dimensions s and d are different, that is to say, s1<>d1 and s2<>d2 hold true. In such a case, it is necessary to extract the edges of the polygons from K', A", and A'" and to determine the long edges therefrom and to check whether or not their distance is at least d1 and d2, respectively. Analogously, it is necessary to determine the short edges and check whether or not their distance is at least s1 and s2, respectively.

The program 1 in FIG. 2 represents a program that is written in a Cadence-like language and carries out these steps. Using the operator "sep", the "drc" instruction determines the distance between the edges of the contacts and the edges of the active areas. The instruction "geomAndNot (A B)" subtracts the intersection set of A and B from the set A. At the end of each line, after the comments symbol "#", the number of computation operations required for the execution of the respective instruction is specified for the figures shown in FIG. 1.

In an exemplary embodiment of the invention, the test of the edge distances is now simplified by directly accessing the edges of the rectangles. At the beginning of the test, all the contacts that lie completely within the area of an active area are determined as in the program 1. The sets K', A", and A'" are formed therefrom. Afterward, it is necessary merely to check whether or not the distance between the short side of a contact and the nearest edge of the active area is at least s1 or s2, and the distance between the long side of the contact and the nearest edge of the active area is at least d1 or d2.

Program 2 in FIG. 2 shows an implementation of these test steps. Program 2 tests the same layout rule as Program 1, but is significantly simpler to program. Moreover, fewer computational operations are required because the geometrical properties required are already prestored in a database. Computation time is, thus, saved.

EXAMPLE II
Layout Rules Depending on Geometrical Orientation

Layout rules, in which the orientation of two polygons with respect to one another is to be taken into account, are employed in the case where many layouts are designed. One example of this is illustrated in FIG. 3.

Figure 3:
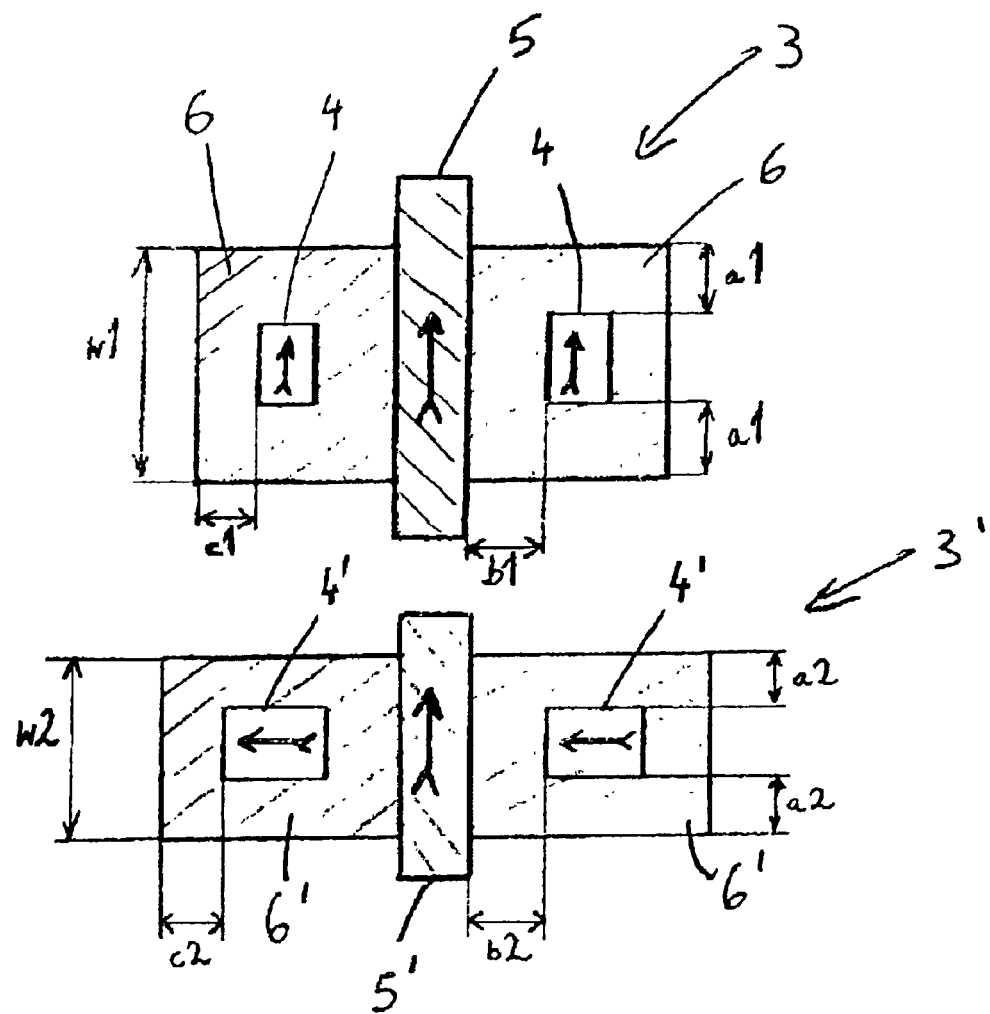
FIG. 3 is a diagrammatic illustration of two transistors having different widths.

FIG. 3 shows two transistors 3 and 3' having different widths w1 and w2, respectively. The rectangles 4 and 4' represent the contacts of the transistors, and the bars 5 and 5' represent the gates thereof. Both the contacts 4 and 4' and the gates 5 and 5' are disposed on hatched diffusion regions 6 and 6', respectively. The layout rules for the dimensions a, b, and c are complied with in both transistors 3 and 3'.

The transistors 3 and 3' differ merely in the orientation of the contacts 4 and 4', respectively. The orientation of the contacts 4 and 4' is represented by arrows and relates to the coordinate system in the plane of the drawing. In transistor 3', the contact 4' is perpendicular to the gate 5', which is undesirable.

The checking of an orientation-dependent layout rule as in FIG. 3 can be carried out only with difficulty and usually implicitly by conventional verification programs. One possible test could generally prohibit a width w2 for diffusion regions. However, at other locations in the layout, this could lead to area being given away.

In practice, in a conventional solution, the width w2 only of transistor diffusion regions would be tested, while non-transistor diffusion regions would not be tested. In many cases, however, the division between transistor diffusion regions and non-transistor diffusion regions cannot be performed. This would have the consequence that the width w2 would be prohibited for all diffusion regions. As a result, false errors would be indicated in the case of non-transistor diffusion. However, a large number of "dummy" errors involve the risk that genuine violations of the layout rules might be overlooked in the layout.

According to an exemplary embodiment of the invention, the orientation of geometrical figures can be taken into account. In FIG. 3, arrows represent the orientations. Accordingly, the orientation of the rectangles representing the contacts 4 and 4' and the gates 5 and 5' is defined with regard to the coordinate system of the plane of the drawing and can be stored as unit vector in the database already mentioned. By a suitable instruction, the verification software calculates the scalar product of the vectors for the purpose of checking the mutual orientation. If K and GC are the sets of contacts and gates, respectively, then the test can be effected in a Cadence-like language by the following instruction:

Drc (Orientation(K) Orientation(GC) vecprod <>0)

EXAMPLE III
Layout Rules Depending on the Geometrical Form

In the future, layout rules will be determined more and more by the optical imaging process. Even nowadays the dimensions of extremely small structures lie below the light wavelength used to expose photo masks. Therefore, diffraction effects must be taken into account to an ever-greater extent during the production of chips, which has direct effects on the formulation of layout rules.

One exemplary embodiment of the invention enables the form of the polygon also to enter into the layout rules in the future. The form of the polygon determines diffraction effects and, thus, the imaging of the polygons on silicon. This will be explained with reference to FIG. 4.

Figure 4:
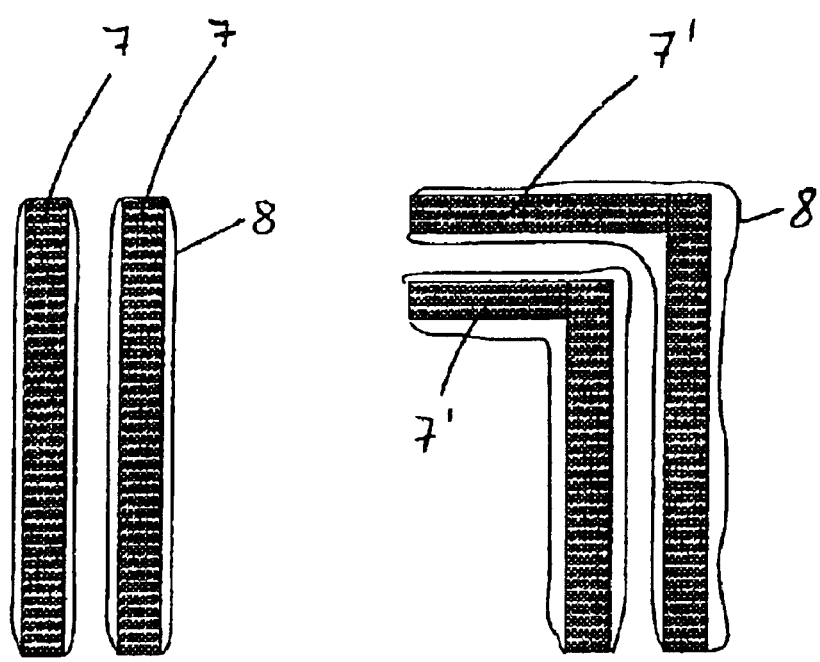
FIG. 4 is a diagrammatic illustration of two contact tracks made of metal for connecting electronic components.

FIG. 4 shows two parallel metal tracks 7 and 7', respectively. The metal tracks 7, 7' are surrounded by lines 8 and 8', respectively, which represent the actual image of the tracks produced by the fabrication process on a silicon wafer. As a result of the fabrication process, the tracks 7 and 7' are widened, inter alia, by diffraction effects. The diffraction effects are significantly more pronounced in the bend of the tracks 7' than at the limbs thereof, and lead, there, virtually to a short circuit between the metal tracks 7'. Therefore, in principle, a smaller minimum distance may be permitted for the metal tracks 7 than for the metal tracks 7'.

Against such a background, then, it is possible to define a layout rule that prescribes different minimum distances depending on the geometrical form of the conductor tracks. To check such a new layout rule, the geometrical form of the conductor tracks is made available to the verification program. In a generalized manner, this means that, for each polygon, the geometrical form thereof is stored in the database, which is not the case with customary verification tools.

Layout Generation Using Basic Forms

The preceding three examples have illustrated layouts whose checking can be implemented either only in laborious fashion or not at all using prior art verification programs. Such a problem is solved by resorting to the geometrical properties of the polygons.

For illustration purposes, structures that principally include rectangles and, thus, represent an idealization of real layouts, which, as a rule, include far more complicated basic forms, have been discussed heretofore. Therefore, each polygon is assigned to a class. Each class is defined by a geometrical basic form, the parameters thereof, and also the associated geometrical operations. Such assignment simplifies the layout verification; moreover, the formulation of new layout rules is made possible. Such an approach is explained in more detail below.

Each class includes a basic form and the properties thereof. The properties are subdivided into parameters of the basic form and extended parameters (e.g., orientation; set of assigned geometrical operations by which the members of a class can be modified). However, the geometrical operations are not intended to include rotations or displacements of the basic form with regard to the coordinate system of the plane of the drawing, but, rather, only operations that change the shape of the basic form.

The process will now be illustrated using the example of a rectangle. All rectangles occurring in a layout can be generated from a square of side length one and by stretching the edges of the square. Consequently, the basic form of the class of rectangles is a square, the parameters are length and width, and a possible extended parameter is the orientation of the rectangle in the coordinate system of the plane of the drawing.

Figure 5A:
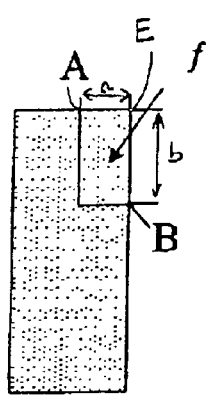
FIGS. 5A to 5C are diagrammatic illustrations of exemplary geometrical operations that can be applied to a rectangle.
Figure 5B:
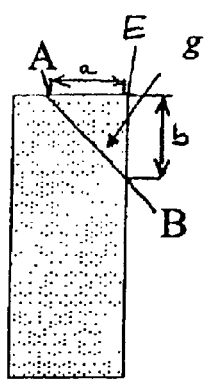
Figure 5C:
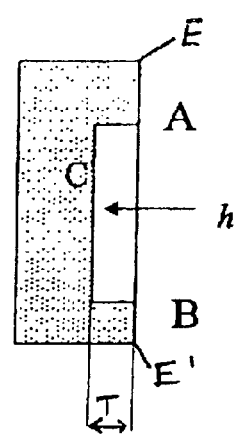

FIGS. 5A to 5C show the geometrical operations that can be applied to the basic form of the class of rectangles. FIGS. 5A and 5B show how the top right corner of a rectangle is displaced inward in different ways by the operations f and g, and, as a result, the form is changed, but not the association with the class of rectangles. In comparison, FIG. 5C generates a notch of depth t in the rectangle by a different operation h.

The geometrical operations f, g, and h belong to the set of the geometrical operations of the class of rectangles. Generally, appropriate geometrical operations include stretching along the rectangle edges and geometrical operations that displace corners and edges of the rectangle inward. All of the operations belonging to a class do not change the class association of the polygon. Therefore, the forms produced by the transformations in FIG. 5 also, likewise, belong to the class of rectangles.

The table of FIG. 6 contains a selection of geometrical basic forms, the parameters thereof, and assigned geometrical operations. The list is merely an example and can be extended as desired by adding further basic forms.

The basic forms of rectangle, trapezoid, and triangle listed in the table need no further explanation. The situation is somewhat different with the N-tracks with and without branching. An N-track without branching is to be understood as an open line run including N segments, the individual subsections i=1 . . . N having a length $L_i$ and running at angles 1 . . . (N−1) to one another.

Figure 7:
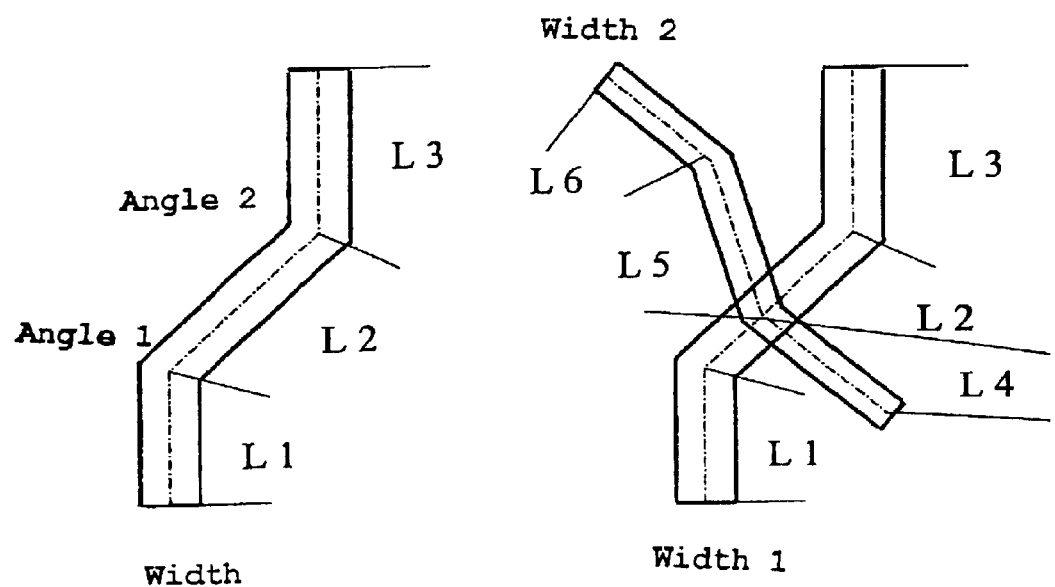
FIG. 7 is a diagrammatic illustration of a so-called N-track for connecting electronic components.

FIG. 7 shows an N-track without branching on the left, and an N-track with branching on the right. The dashed-dotted lines correspond to the axes of symmetry of the tracks. The lengths are measured between two bend points, and angle is understood to be in each case the smaller angle at a bend point between the axes of symmetry of the segments. Each track can have a different width.

The basic forms listed suffice to be able to construct a layout. As a rule, electronic components are represented by rectangles in the layout, such as, for example, transistors (see FIG. 3).

The N-tracks without branching represent a generalization of electrical connections between individual components. Thus, as a rule, an electrical line will not run straight between two points A and B, but rather will change direction repeatedly along its course. As a result, buses or wiring configurations within a subcircuit can also be represented by the geometrical basic form of the N-track. In contrast, the basic form of rectangle cannot be transferred to an N-track without branching.

The classes of trapezoids and triangles are necessary to have enough of a margin of configuration freedom when drawing in area-critical situations.

Branching N-tracks serve for connecting more than two points of a circuit to one another, in which case, ramifications are permitted to be as complicated as desired. It is, thus, possible to construct, for example, T-shaped branching configurations of supply lines.

A Selection of Geometrical Deformations

When designing a layout, it may not be possible, under certain circumstances, exclusively to adhere to the basic forms presented above. Rather, corners on a basic form have to be beveled and/or pulled inward, as shown in FIGS. 5A to 5C. Furthermore, notches may be required at the edges. To be able to deform basic forms, the geometrical operations specified in the table of FIG. 6 are applied to the associated basic forms.

EXAMPLE 1

Gradation of a Corner (FIG. 5A)

For the gradation of a corner, points A and B are selected on adjacent edges of the basic form at a distance a and b, respectively, from a corner E. Afterward, the section A-E is displaced parallel by the distance a into the interior of the basic form (toward the left in FIG. 5A). There is an analogous procedure with the section B-E; the latter is displaced by the distance b into the interior of the basic figure (downward in FIG. 5A.).

EXAMPLE 2

Beveling of a Corner (FIG. 5B)

Beginning with the corner E of a basic form, the latter is displaced firstly by a distance a to a selected point A on one of the two adjacent edges, and, then, by a distance b to a selected point B on the other adjacent edge. The points A and B are then connected by a straight line. As a result, the corner is beveled. In such a case, the points A and B must respectively lie between the corner E and the adjacent corner.

EXAMPLE 3

Notch Along an Edge

Between two corners E and E', a notch of depth T is to be created between two points A and B that are to be defined. In such a case, the notch, as shown in FIG. 5C, is "cut" into the basic figure perpendicular to the edge between the corners E and E'.

In all cases, the parameters assigned to a geometrical transformation are stored in the database with regard to the transformed basic form, from which the polygon formed by transformation of a basic form can be derived in a simple manner at any time. On the other hand, each polygon so formed remains assigned to a basic form.

The geometrical operations described above are by way of example and can be extended. The assignment of geometrical operations to basic forms must be effected, however, such that one basic form cannot be transformed into another basic form by application of assigned geometrical operations. For example, no geometrical operation is permitted to be able to be effected such that a triangle is transformed into a trapezoid by gradation of a corner (see Example 1 above). It is only, thus, that an unambiguous assignment of each figure produced by transformation of a basic form to the original basic form is preserved.

Implementation of the Concept

As set forth, the invention is based on the idea of using basic forms to simplify the verification of layouts and to extend the possibilities of the verification, in order to be able to perform a check of the more complicated layout rules that are to be expected in the future.

Such a concept can be realized, for example, by a graphical layout tool that, for designing the layout, provides only geometrical basic forms for selection (for example, on the left-hand edge of the screen). After the selection of a geometrical basic form, the latter can be positioned on the drawing area and be manipulated by a mouse, for example, the program permitting, by manipulation, only the geometrical operations assigned to the basic form. The parameters listed in the table of FIG. 6 are ultimately determined as a result.

The graphical interface of the layout tool can be programmed such that the shape of the basic forms can be modified interactively on the screen by the geometrical operations from the table of FIG. 6. The information on the modified basic forms is subsequently stored in the database. During the verification of the layout, it is, then, possible to access all the information of a polygon that it has through its class association. Furthermore, the verification software may also be programmed, however, such that the additional (extended) parameters listed in the table of FIG. 6 are also accessed.

Furthermore, it is also possible to convert databases that do not store polygons according to the methodology presented. To convert such databases, software is created that examines the polygons stored therein for predetermined criteria (e.g., for the number of sides, length of the sides, angle between the sides), assigns basic forms to the polygons, and, then, writes them into a new database. During the verification, the basic forms stored in the new database can then be accessed.

Figure 8:
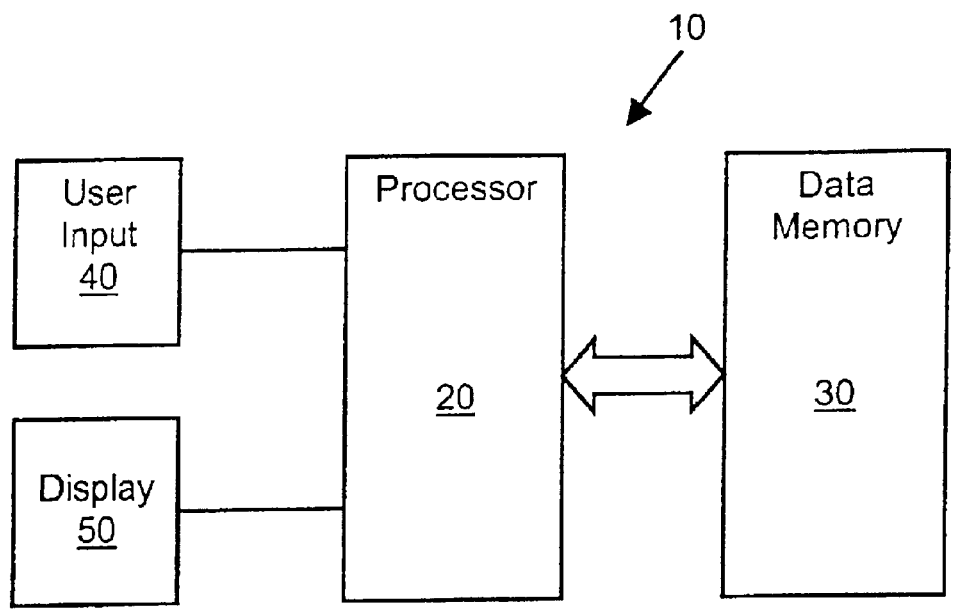
FIG. 8 is a block circuit diagram of a data processing system according to the invention for designing a layout of an integrated electronic circuit having a multiplicity of electronic components.

FIG. 8 is a block circuit diagram of a data processing system 10 according to the invention for designing a layout of an integrated electronic circuit having a multiplicity of electronic components. The system 10 has a processor 20 and a data memory 30 that stores first data, which define a predetermined set of geometrical basic forms through a multiplicity of basic-form-specific and permanent geometrical parameters, and also a predetermined assignment of each of the electronic components of a layout design to the respective parameters defining one or more of the geometrical basic forms, and stores second data, which represent a multiplicity of geometrical operations—which can be applied to the geometrical basic forms—for forming geometrical Figures that differ from the geometrical basic forms, the parameters defining a geometrical basic form being unalterable through application of a geometrical operation to this geometrical basic form. The processor 20 can receive input from a user through a user input 40 and can display information on a display 50.

It should be noted that the invention is not restricted to the exemplary embodiments described, but rather encompasses modifications within the scope of protection defined by the claims.

It shall additionally be noted that the term "electronic components" in the description and the claims is also intended to encompass conductor tracks.

I claim:

1. A data processing system for designing a layout of an integrated electronic circuit having a multiplicity of electronic components, comprising:
   a processor programmed to process data including:
      first data defining:
         a predetermined set of geometrical basic forms through a multiplicity of basic-form-specific and permanent geometrical parameters; and
         a predetermined assignment of each of the electronic components of a layout design to the respective one of the geometrical parameters defining at least one of the geometrical basic forms; and
      second data representing a multiplicity of geometrical operations, the geometrical operations to be applied to the geometrical basic forms to form geometrical figures differing from the geometrical basic forms, the geometrical parameters defining a geometrical basic form unalterable through application of one of the geometrical operations to the geometrical basic form, the geometrical figures representing the electronic components; and
   a data memory connected to said processor and storing the data, said processor programmed to at least one of store the data in said data memory and read the data from said data memory.

2. The data processing system according to claim 1, wherein said processor is programmed to retrieve the data relating to the geometrical basic forms from said data memory and to check the layout design by applying a predetermined set of layout rules to the geometrical parameters represented by the retrieved data.

3. The data processing system according to claim 2, wherein each of the geometrical parameters describes a form of a respectively assigned geometrical basic form.

4. The data processing system according to claim 2, wherein each of the geometrical parameters describes an absolute position of a respectively assigned geometrical basic form in a reference system defined with respect to the layout design.

5. The data processing system according to claim 2, wherein each of the geometrical parameters describes a relative position of a respectively assigned geometrical basic form with respect to other geometrical basic forms in a reference system defined with respect to the layout design.

6. The data processing system according to claim 2, wherein each of the geometrical parameters describes an orientation of a respectively assigned geometrical basic form in a reference system defined with respect to the layout design, from which an orientation of an assigned electronic component can be derived respectively.

7. The data processing system according to claim 2, wherein each of the geometrical parameters describes an orientation of a respectively assigned geometrical basic form relative to other geometrical basic forms in a reference system defined with respect to the layout design, from which an orientation of an assigned electronic component relative to an orientation of an electronic components assigned to other geometrical basic forms can be derived respectively.

8. The data processing system according to claim 6, wherein said processor is programmed to form the respective one of the geometrical parameters describing the orientation with a unit vector.

9. The data processing system according to claim 7, wherein said processor is programmed to form the respective one of the geometrical parameters describing the orientation with a unit vector.

10. The data processing system according to claim 2, wherein each of the geometrical parameters describes at least one of the position and the profile of edges of a respectively assigned geometrical basic form in a reference system defined with respect to the layout design.

11. The data processing system according to claim 10, wherein each of the geometrical parameters describes a length of the edges of the respectively assigned geometrical basic form.

12. The data processing system according to claim 2, wherein said processor is programmed to form a set of the geometrical basic forms with a predetermined set of polygons.

13. The data processing system according to claim 12, wherein the predetermined set of polygons contain at least one geometrical basic form selected from the group consisting of a rectangle, an N-track without branching, a triangle, a trapezoid, and an N-track with branching.

14. The data processing system according to claim 13, wherein said processor is programmed to form each geometrical figure produced by application of a geometrical operation to a geometrical basic form with a polygon.

15. The data processing system according to claim 13, wherein each geometrical figure produced by application of a geometrical operation to a geometrical basic form forms a polygon.

16. The data processing system according to claim 1, including:
   a user input device connected to said processor for transmitting information from a user;
   a display connected to said processor for displaying information; and
   said processor being programmed:
      to generate a first output signal to display information representing the geometrical basic forms and the geometrical operations at said display; and
      to select displayed geometrical basic forms and geometrical operations based upon the information input to said user input device to apply a selected geometrical operation to a selected geometrical basic form and, as a result thereof, said processor being programmed to generate and store the data in said data memory representing an assignment of the selected geometrical basic form to the selected geometrical operation.

17. The data processing system according to claim 16, wherein said display is a screen.

18. The data processing system according to claim 16, wherein said processor is programmed:
   to calculate a geometrical figure formed by application of the selected geometrical operation to the selected geometrical basic form; and
   to generate a second output signal to display the geometrical figure at said display.

19. The data processing system according to claim 18, wherein said processor is programmed to apply the selected geometrical operation to change the selected geometrical basic form only with respect to a shape of the geometrical figure formed.

20. The data processing system according to claim 18, wherein said processor is programmed to change the selected geometrical basic form only with respect to shape from the geometrical figure formed by application of the selected geometrical operation.

21. The data processing system according to claim 16, wherein:
   said user input device, said display, and said processor form a graphical user interface; and
   said processor is programmed to interactively modify displayed geometrical basic forms to be selected through said graphical user interface.

22. The data processing system according to claim 16, wherein said processor is programmed:
   to provide a graphical user interface through said user input device and said display; and
   to interactively modify displayed geometrical basic forms to be selected with said graphical user interface.

23. A method for designing a layout of an integrated electronic circuit having electronic components, which comprises:
   retrieving data from a data memory, the data representing geometrical basic forms;
   assigning each of the electronic components of the electronic circuit to at least one of the geometrical basic forms;
   selecting and configuring one of selected geometrical basic forms within a reference system defined for the layout design;
   retrieving data from the data memory, the retrieved data representing a multiplicity of geometrical operations possible for application to the geometrical basic forms;
   selecting and applying one of the geometrical operations to the geometrical basic form selected in the selecting and configuring step to generate a geometrical figure differing in shape from the geometrical basic form, the geometrical figure representing at least one of the electronic components; and
   generating and storing data representing an assignment of the geometrical basic form selected in the selecting and configuring step to the selected geometrical operation applied thereto.

24. A computer program for designing a layout of an integrated electronic circuit having electronic components on a computer, which comprises the steps of:
   retrieving data from a data memory, the data representing geometrical basic forms;
   assigning each of the electronic components of the electronic circuit to at least one of the geometrical basic forms;
   selecting and configuring one of selected geometrical basic forms within a reference system defined for the layout design;
   retrieving data from the data memory, the retrieved data representing a multiplicity of geometrical operations possible for application to the geometrical basic forms;
   selecting and applying one of the geometrical operations to the geometrical basic form selected in the selecting and configuring step to generate a geometrical figure differing in shape from the geometrical basic form, the geometrical figure representing at least one of the electronic components; and generating and storing data representing an assignment of the geometrical basic form selected in the selecting and configuring step to the selected geometrical operation applied thereto.

25. A method for designing a layout of an integrated electronic circuit having electronic components, which comprises:

providing data in a data memory, a first portion of the data representing geometrical basic forms and a second portion of the data representing a set of geometrical operations to be applied to a respective one of the geometrical basic forms;

retrieving at least some of the first portion of the data from the data memory;

assigning each of the electronic components of the electronic circuit to at least one of the geometrical basic forms;

selecting and configuring one of the selected geometrical basic forms within a reference system defined for the layout design;

retrieving at least some of the second portion of the data from the data memory;

selecting and applying one of the geometrical operations to the geometrical basic form selected in the selecting and configuring step to generate a geometrical figure differing in shape from the geometrical basic form, the geometrical figure representing at least one of the electronic components; and generating and storing data representing an assignment of the geometrical basic form selected in the selecting and configuring step to the selected geometrical operation applied thereto.

26. A computer program for designing a layout of an integrated electronic circuit having electronic components on a computer, which comprises the steps of:

providing data in a data memory, a first portion of the data representing geometrical basic forms and a second portion of the data representing a set of geometrical operations to be applied to a respective one of the geometrical basic forms;

retrieving at least some of the first portion of the data from the data memory;

assigning each of the electronic components of the electronic circuit to at least one of the geometrical basic forms;

selecting and configuring one of the selected geometrical basic forms within a reference system defined for the layout design;

retrieving at least some of the second portion of the data from the data memory;

selecting and applying one of the geometrical operations to the geometrical basic form selected in the selecting and configuring step to generate a geometrical figure differing in shape from the geometrical basic form, the geometrical figure representing at least one of the electronic components; and generating and storing data representing an assignment of the geometrical basic form selected in the selecting and configuring step to the selected geometrical operation applied thereto.

27. A data processing system for designing a layout of an integrated electronic circuit, comprising:

a first data memory storing data entries each having a set of parameters representing a predetermined geometrical basic form;

a second data memory storing first data representing a multiplicity of geometrical figures; and a processor connected to said first data memory and to said second data memory, said processor programmed:
to read the first data;
to process the first data and ascertain correspondence of each of the geometrical figures represented by the first data to one of the sets of parameters; and
to generate second data representing an assignment of each of the geometrical figures to a respective one of the geometrical basic forms to whose set of parameters correspondence was ascertained, the geometrical figures representing at least one of the electronic components.

* * * * *